United States Patent
Begg

(10) Patent No.: US 7,657,993 B2
(45) Date of Patent: Feb. 9, 2010

(54) MANUFACTURE OF SHIM WINDINGS

(75) Inventor: Michael Colin Begg, Worthing (GB)

(73) Assignee: Tesla Engineering Limited, Sussex (GB)

( * ) Notice: Subject to any disclaimer, the term of this patent is extended or adjusted under 35 U.S.C. 154(b) by 816 days.

(21) Appl. No.: 10/812,917

(22) Filed: Mar. 31, 2004

(65) Prior Publication Data

US 2004/0194293 A1    Oct. 7, 2004

(30) Foreign Application Priority Data

Apr. 3, 2003 (GB) ................................. 0307729.4

(51) Int. Cl.
  *H01F 5/02* (2006.01)
(52) U.S. Cl. .......................... 29/606; 29/602.1; 29/827; 336/199; 336/225
(58) Field of Classification Search ................ 29/602.1, 29/605, 606, 827; 336/199, 225; 219/121.68, 219/121.69; 324/318, 324; 361/813; 700/180, 700/182
See application file for complete search history.

(56) References Cited

U.S. PATENT DOCUMENTS

| | | | | |
|---|---|---|---|---|
| 1,801,214 A | * | 4/1931 | Von Henke ............ 29/602.1 X |
| 4,840,700 A | | 6/1989 | Edelstein et al. |
| 5,197,170 A | * | 3/1993 | Senda et al. ........... 29/602.1 X |
| 5,349,744 A | * | 9/1994 | Takahashi .................. 29/602.1 |
| 5,946,198 A | * | 8/1999 | Hoppe et al. ................ 361/813 |
| 6,052,627 A | * | 4/2000 | Nakamura .................. 700/182 |
| 6,161,276 A | | 12/2000 | Droz |
| 6,175,237 B1 | * | 1/2001 | Doty et al. .................. 324/318 |
| 6,176,010 B1 | | 1/2001 | Droz |
| 6,311,389 B1 | | 11/2001 | Uosaki et al. |
| 6,615,481 B1 | * | 9/2003 | LaPlante et al. ............ 29/602.1 |

FOREIGN PATENT DOCUMENTS

| | | | | |
|---|---|---|---|---|
| JP | 58-19148 | * | 2/1983 | .................. 29/605 |
| JP | 2000-223318 | * | 8/2000 | |
| WO | WO 01/35484 A1 | | 5/2001 | |

* cited by examiner

*Primary Examiner*—A. Dexter Tugbang
(74) *Attorney, Agent, or Firm*—Nixon & Vanderhye PC

(57) ABSTRACT

A shim coil for use in magnetic resonance imaging spectroscopy (MRIS) is formed by cutting or punching in a sheet of electrically conductive material the required coil pattern. The pattern can be punched using a CNC punch or stamping machine.

4 Claims, 4 Drawing Sheets

Schematic sketch of a punched shim saddle (one of a set)

Example of a transverse shim connection scheme (unwrapped)

MANUFACTURE OF SHIM WINDINGS

BACKGROUND

1. Technical Field

This invention relates to the manufacture of coils for use in magnetic resonance imaging spectroscopy (MRIS).

2. Related Art

Magnetic resonance imaging and spectroscopy (MRIS) systems generally comprise a plurality of cylindrical concentric coils which are located around a region within which a patient can be located. The coils include an outermost DC coil which is used to provide a strong constant magnetic field, an inner radio frequency (RF) coil arrangement which is arranged concentrically within the DC coil and a gradient coil assembly which is located between the RF coil and the outer DC coil. The gradient coil assembly is arranged to generate a time-varying audio frequency magnetic field which causes the response frequency of the nuclei of the patient to depend upon their positions within the field. The coils which generate the strong constant magnetic field are generally super-conducting coils. The presence of a patient in the magnetic field may distort the main magnetic field making it insufficiently uniform for imaging or spectroscopic measurements. A known way of counter-acting this effect is by providing multi-turn electrical windings known as shim coils and driving DC electrical currents through those windings. A typical high performance MRIS system may contain 8 to 12 shim coils, each of which is arranged to correct an inhomogeneity with a particular spatial form. The shim coils can also be used to correct intrinsic inhomogeneities of the super-conductive magnet itself.

It is common practice to incorporate shim coils within the structure of the actively shielded gradient coil assemblies which are switched rapidly on and off in a precisely timed sequence to generate MR images. The gradient sequence contains a range of frequencies from zero to 10 kHz or more and this is often referred to as "audio frequency".

Magnets with different geometries are currently being developed and these include what are known as open magnets with bi-planar gradient and shim assemblies. The present invention is applicable equally to these new geometries.

Shim coils can be divided into two classes. The first class is made up of axial shim coils which comprise a series of complete circular turns and which generate axisymmetric field components. The second class is known as transverse shim coils and these include multiple saddle coils which are typically disposed symmetrically on the surface of a cylinder or some other surface. Depending upon the field component to be corrected a transverse shim can typically comprise 2, 4 6, 8 or 12 saddles connected in series with successive saddles having alternating signs as shown for example in FIG. 2 of the drawings.

A number of methods are known for fabricating shim coils. These include photo-etching and winding using insulated conductor. The present invention is concerned with an improved method for fabricating shim coils which is applicable not only to saddle type arrangements, but also to axial shim coils.

BRIEF SUMMARY

According to the present invention there is provided a method of forming an electrical coil which comprises forming the required coil pattern in a sheet of electrically conductive material by cutting or punching. The pattern may be punched from the sheet using a CNC punch or stamping machine. Alternatively, the pattern may be cut using a laser or a water jet. The resulting coil may be a shim coil for use in a MRIS apparatus.

BRIEF DESCRIPTION OF THE DRAWINGS

The invention will be described now by way of example only with particular reference to the accompanying drawings. In the drawings.

DETAILED DESCRIPTION OF EXEMPLARY EMBODIMENTS

Figure 1:
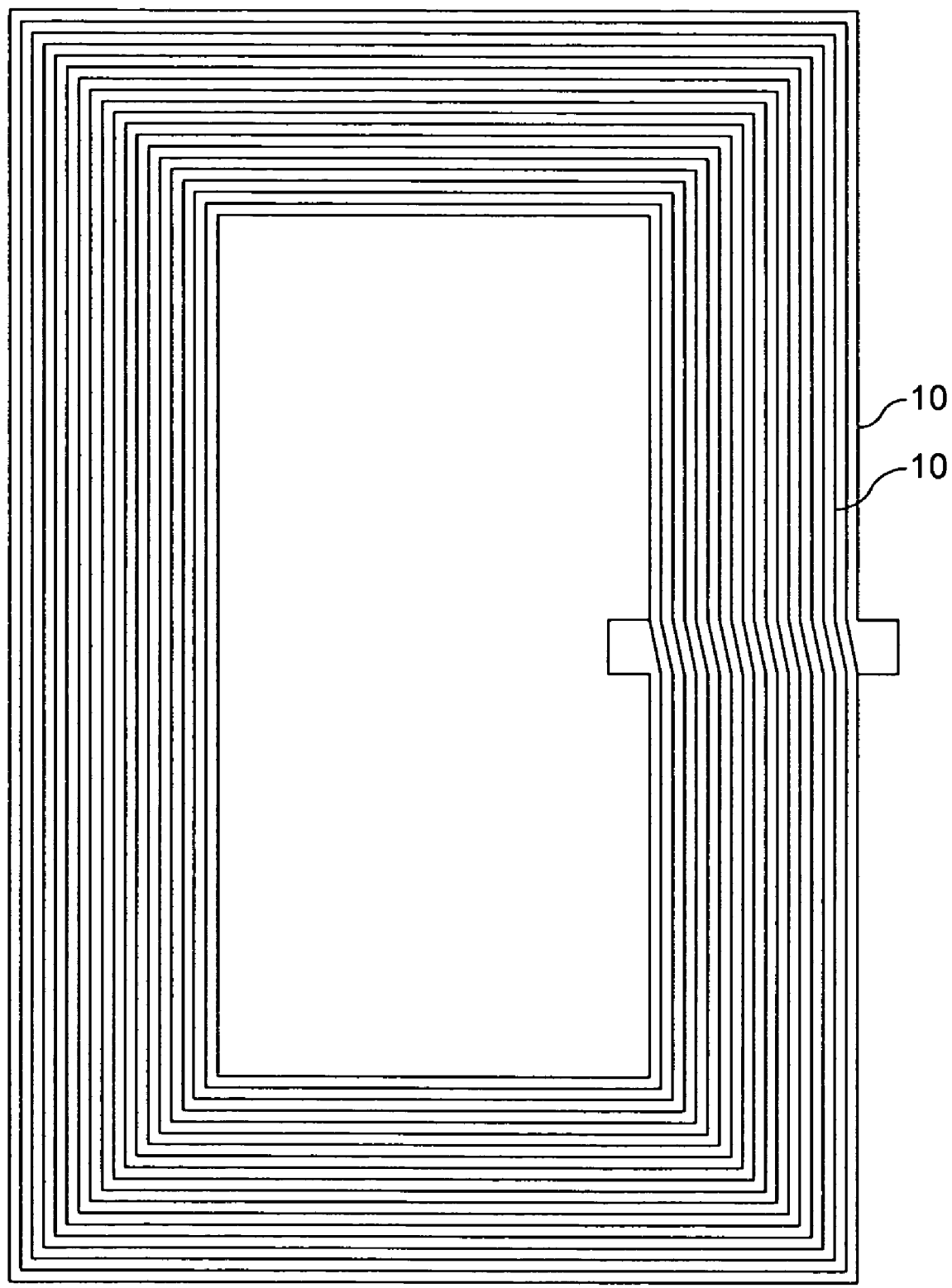
FIG. 1 is a schematic view of a shim saddle coil formed by the method in accordance with the present invention.
Figure 2:
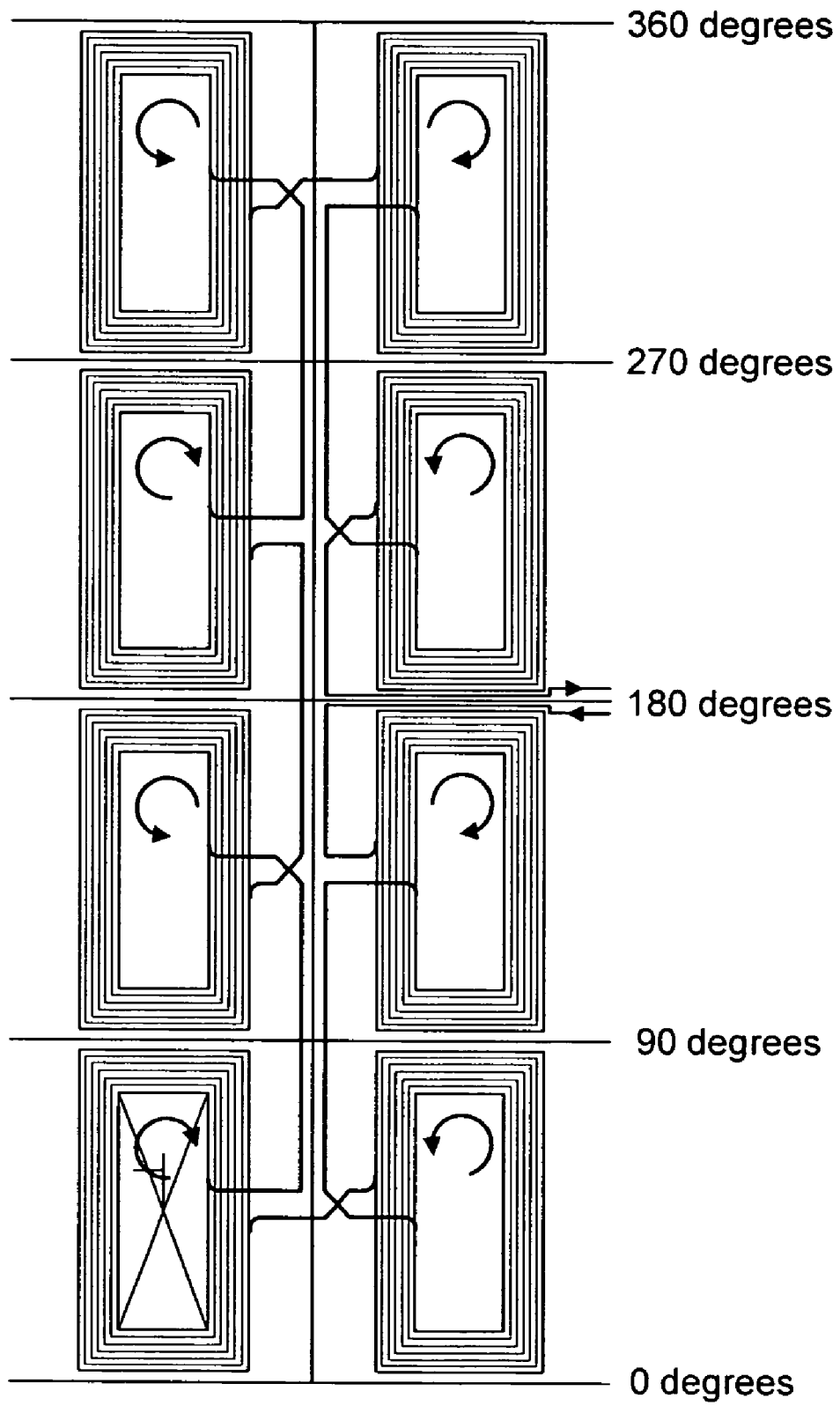
FIG. 2 illustrates how shim saddle coils are arranged in a MRIS apparatus.

A method of forming a shim coil in accordance with one embodiment of the present invention comprises the following steps. A sheet of solid conductor is partially cut to form the conductor pattern shown generally in FIG. 1 of the drawings. This cutting is carried out in such a way that bridges or narrow joins are left periodically between the conductive elements (10) for support. The cutting process can be carried out by a variety of techniques which include punching, water-jet cutting, or laser cutting. In the case of punching, the operation can be carried out using a CNC machine.

The next step in the process is to stick the partially cut pattern onto an insulating backing material. After this step, the bridges or joining portions are cut away in a second cutting operation. Then a further backing layer is added in order to insulate the holes which are formed during the cutting operation which removes the bridges. Finally the pattern is rolled where necessary prior to assembly and connection.

Figure 3:
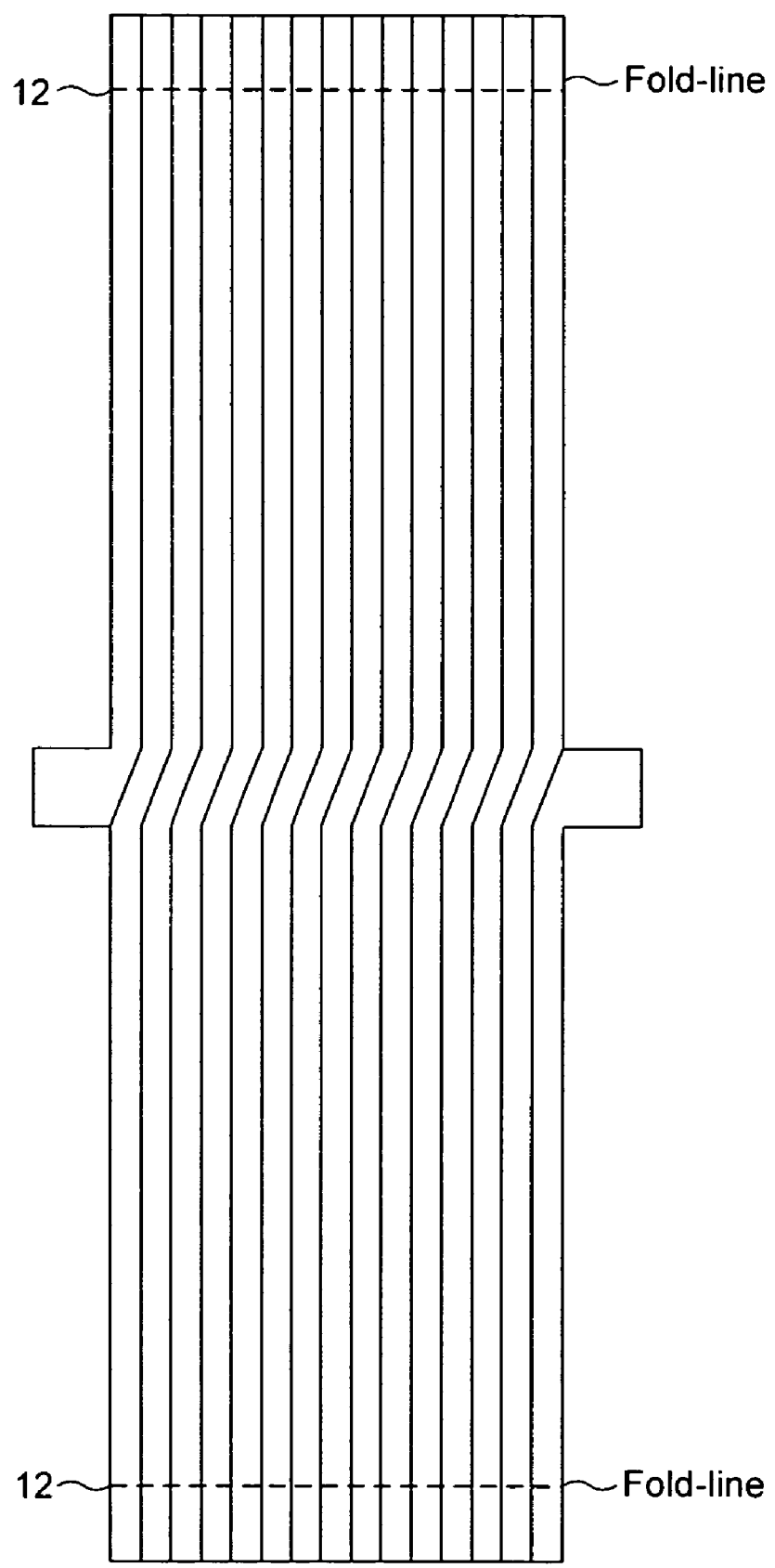
FIG. 3 illustrates how an axial shim coil can be made.

In order to form an axial shim coil a series of discontinuous arcs can be punched in a sheet of conductive material (FIG. 3). The discontinuous arcs can include the bridges referred to above with reference to FIG. 1. The sheet is then rolled so that opposite ends are adjacent and continuous arcs formed. The opposite ends can be folded about fold lines (12) so that they are juxtaposed in a radial direction. The coil is then located in an MRIS apparatus and electrical connections move to (join) the juxtaposed end portions.

Figure 4:
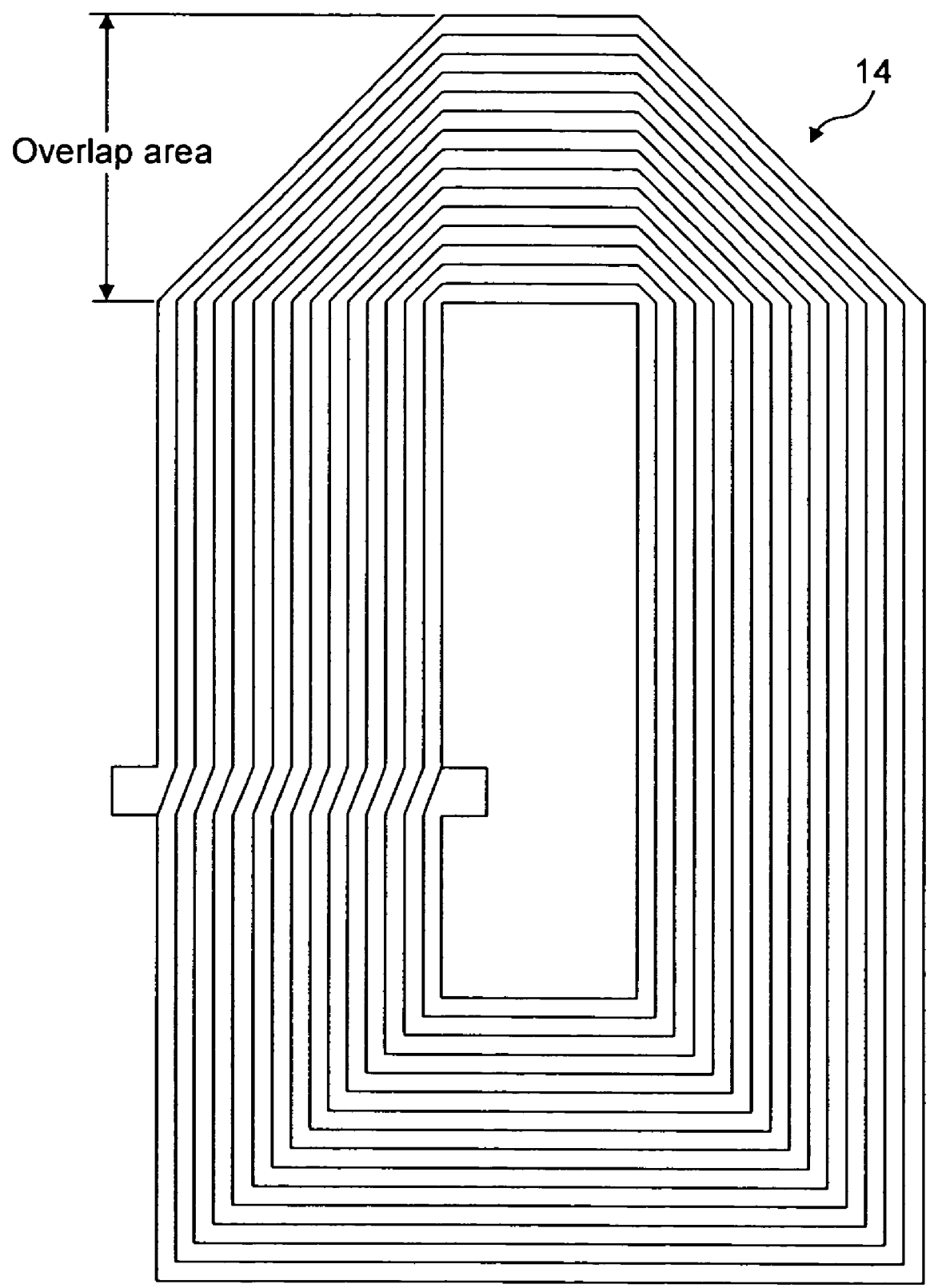
FIG. 4 illustrates the formation of an anti-symmetic shim coil.

Antisymmetic shim coils can also be formed as shown in FIG. 4. A saddle coil is punched from a sheet of conductive material the saddle extending over more than a circumference. This gives an overlap area (14) where axial circuits are cancelled.

In comparison to coils which are hand wound from insulated strips, the method described above has the following advantages:

1. Repeatability
2. Accuracy
3. Correspondence with theoretical design—no rounding of the corners of a saddle during winding.
4. Reduced labour and skill.
5. Improved structural adhesion compared to insulated conductor.
6. Comparable mean current density when all forms of insulation are taken into account.

In comparison to the prior art technique of photo-etching of coils the above described method has the following advantages:

1. Reduced cost
2. It is readily scalable to large currents typically of 1 to 10 amps.
3. Increased mean current density when all forms of insulation are taken into account.

What is claimed is:

1. A method of forming an electrical MRIS shim coil, said method comprising:
   forming an MRIS shim coil pattern in a sheet of electrically conductive material by punching; and
   attaching the punched pattern of conductive material to an insulating substrate to form an MRIS shim coil,
   wherein the forming of the MRIS shim coil by punching leaves bridging portions between lengths of conductive material in the cut pattern in which the lengths will form coil conductors in a finished MRIS shim coil;
   said method further comprising removal of said bridging portions after attachment of the punched pattern to the substrate.

2. A method of making an electrical MRIS shim coil, said method comprising:
   creating plural adjacently positioned MRIS shim coil windings by punch-cutting a continuous sheet of electrically conductive material along spaced apart paths and removing cut-away material along said paths to leave space therealong; and
   subsequently affixing remaining portions of the conductive material to an insulating substrate,
   wherein said punch-cutting comprises:
   a first punch-cutting step wherein plural spaced-apart bridges of material are left along the cutting paths to physically maintain adjacent as-cut positions of conductive MRIS shim coil windings while said insulating substrate is adhered thereto, followed by a second cutting step wherein said spaced-apart bridges are cut off to completely form an electrical separation between the adjacent MRIS shim coil windings thus formed.

3. A method as in claim 2 wherein said punch-cutting step creates one continuous spiral cut path in said continuous sheet of electrically conductive material.

4. A method as in claim 2 wherein said punch-cutting step creates plural parallel cut paths in said continuous sheet of electrically conductive material to create opposing ends that are bent and electrically connected by forming the remaining portions of conductive material, and the supporting insulating substrate, into a closed shape.

* * * * *